US012287379B2

(12) United States Patent
Suetsugu

(10) Patent No.: US 12,287,379 B2
(45) Date of Patent: Apr. 29, 2025

(54) PRESENT-POSITION MEASUREMENT SYSTEM, PRESENT-POSITION MEASUREMENT DEVICE, PRESENT-POSITION MEASUREMENT PROGRAM, MAGNETIC-FIELD GENERATION DEVICE, AND MAGNETIC-FIELD GENERATION PROGRAM

(71) Applicant: Katsunori Suetsugu, Tokyo (JP)

(72) Inventor: Katsunori Suetsugu, Tokyo (JP)

( * ) Notice: Subject to any disclaimer, the term of this patent is extended or adjusted under 35 U.S.C. 154(b) by 277 days.

(21) Appl. No.: 18/073,029

(22) Filed: Dec. 1, 2022

(65) Prior Publication Data

US 2023/0176144 A1 Jun. 8, 2023

(30) Foreign Application Priority Data

Dec. 8, 2021 (JP) ................................. 2021-199492

(51) Int. Cl.
*G01R 33/02* (2006.01)
(52) U.S. Cl.
CPC .................................. *G01R 33/02* (2013.01)
(58) Field of Classification Search
CPC . G01R 33/0017; G01R 33/0023; G01R 33/02
See application file for complete search history.

(56) References Cited

U.S. PATENT DOCUMENTS

| 11,506,727 | B2 * | 11/2022 | Moriya | G01R 33/091 |
| 2005/0046415 | A1 * | 3/2005 | Kato | F02M 26/48 |
| | | | | 324/207.24 |
| 2019/0128698 | A1 * | 5/2019 | Umehara | G02B 7/08 |

FOREIGN PATENT DOCUMENTS

| JP | 7-255744 A | | 10/1995 |
| JP | 8-500441 A | | 1/1996 |
| JP | 2013-120186 A | | 6/2013 |
| JP | 2013-256840 A | | 12/2013 |
| JP | 2014-106009 A | | 6/2014 |
| JP | 2018-32901 A | | 3/2018 |
| JP | 2019-76730 A | | 5/2019 |
| JP | 2022066992 A | * | 5/2022 |
| KR | 10-2007-0032127 A | | 3/2007 |
| KR | 101117218 B1 | * | 3/2012 |
| KR | 20210125737 A | * | 10/2021 |

OTHER PUBLICATIONS

Notice of Reasons for Refusal dated Feb. 9, 2022, issued in counterpart of Japanese Patent Application No. 2021-199492, with English Translation (11 pages).

(Continued)

*Primary Examiner* — Andre J Allen
(74) *Attorney, Agent, or Firm* — WHDA, LLP

(57) ABSTRACT

A present-position measurement system includes a magnetic-field generation unit that generates a magnetic field, a magnetic sensor that measures a direction of the magnetic field generated by the magnetic-field generation unit, and a present-position measurement unit that measures a present position of the magnetic sensor. The present-position measurement unit measures the present position of the magnetic sensor relative to the magnetic-field generation unit based on the direction of the magnetic field measured by the magnetic sensor.

19 Claims, 13 Drawing Sheets

(56) References Cited

OTHER PUBLICATIONS

Notice of Reasons for Refusal dated May 25, 2022, issued in counterpart of Japanese Patent Application No. 2021-199492, with English Translation (8 pages).
Notice of Reasons for Refusal dated Sep. 7, 2022, issued in counterpart of Japanese Patent Application No. 2021-199492, with English Translation (19 pages).

* cited by examiner

PRESENT-POSITION MEASUREMENT SYSTEM, PRESENT-POSITION MEASUREMENT DEVICE, PRESENT-POSITION MEASUREMENT PROGRAM, MAGNETIC-FIELD GENERATION DEVICE, AND MAGNETIC-FIELD GENERATION PROGRAM

CROSS REFERENCE TO RELATED APPLICATION

This application is based upon and claims the benefit of priority from Japanese Patent Application No. 2021-199492 filed Dec. 8, 2021, the entire contents of which are incorporated herein by reference.

BACKGROUND OF THE INVENTION

1. Technical Field

The present invention relates to a present-position measurement system that measures a present position, a present-position measurement device, a present-position measurement program, a magnetic-field generation device, and a magnetic-field generation program.

2. Description of the Related Art

As a conventional present-position measurement system, a global positioning system (GPS) that measures a present position is known (see, for example, JP 2013-120186 A).

SUMMARY OF THE INVENTION

However, a conventional present-position measurement system has problems that the accuracy of present position measurement is low and the speed of present position measurement is slow.

Therefore, a purpose of the present invention is to provide a present-position measurement system, a present-position measurement device, a present-position measurement program, a magnetic-field generation device, and a magnetic-field generation program that are capable of improving the accuracy and speed of present position measurement.

A present-position measurement system according to the present invention includes a magnetic-field generation unit that generates a magnetic field, a magnetic sensor that measures a direction of the magnetic field generated by the magnetic-field generation unit, and a present-position measurement unit that measures a present position of the magnetic sensor, in which the present-position measurement unit measures the present position of the magnetic sensor relative to the magnetic-field generation unit based on the direction of the magnetic field measured by the magnetic sensor.

With this configuration, the present-position measurement system according to the present invention measures, based on the direction of the magnetic field measured by the magnetic sensor, the present position of the magnetic sensor relative to the magnetic-field generation unit having generated the magnetic field, and can thus improve the accuracy and speed of the present position measurement compared to conventional systems.

The present-position measurement system according to the present invention may include a plurality of the magnetic-field generation units arranged apart from each other, and the present-position measurement unit may measure the present position of the magnetic sensor relative to the plurality of magnetic-field generation units based on the direction of the magnetic field measured by the magnetic sensor.

With this configuration, the present-position measurement system according to the present invention measures the present position of the magnetic sensor relative to the plurality of magnetic-field generation units arranged apart from each other, and can thus improve the accuracy of the present position measurement.

The present-position measurement system according to the present invention may include a magnetic-field generation-position management unit that manages a position of the magnetic-field generation unit in a specific space, and the present-position measurement unit may measure the present position of the magnetic sensor in the space based on the position managed by the magnetic-field generation-position management unit and the present position of the magnetic sensor relative to the magnetic-field generation unit.

With this configuration, the present-position measurement system according to the present invention measures the present position of the magnetic sensor in the specific space based on the position of the magnetic-field generation unit in the specific space managed by the magnetic-field generation-position management unit and the present position of the magnetic sensor relative to the magnetic-field generation unit, and can thus improve the accuracy and speed of the present position measurement of the magnetic sensor in the specific space as compared to conventional systems.

In the present-position measurement system according to the present invention, the present-position measurement unit may measure the present position of the magnetic sensor when the authentication of the magnetic-field generation unit has been succeeded.

With this configuration, the present-position measurement unit measures the present position of the magnetic sensor when the authentication of the magnetic-field generation unit has been succeeded, and the present-position measurement system according to the present invention can thus reduce the possibility of unauthorized use of the present position measurement.

The present-position measurement system according to the present invention may include a magnetic-field generation device including the magnetic-field generation unit, in which the magnetic-field generation device may cause the magnetic-field generation unit to generate the magnetic field when the authentication of the magnetic sensor has been succeeded.

With this configuration, the magnetic-field generation device causes the magnetic-field generation unit to generate the magnetic field when the authentication of the magnetic sensor has been succeeded, and the present-position measurement system according to the present invention can thus reduce the possibility of unauthorized use of the present position measurement.

The present-position measurement system according to the present invention may include a magnetic-field generation device including the magnetic-field generation unit, in which the magnetic-field generation device may change a strength of the magnetic field to be generated by the magnetic-field generation unit.

With this configuration, the magnetic-field generation device can change the strength of the magnetic field to be generated by the magnetic-field generation unit, and the present-position measurement system according to the present invention can thus adjust the strength of the magnetic field to be generated by the magnetic-field generation unit to an appropriate strength depending on the environment around the magnetic-field generation device.

A present-position measurement device according to the present invention includes a present-position measurement unit that measures a present position of a magnetic sensor that measures a direction of a magnetic field generated by a magnetic-field generation unit that generates the magnetic field, in which the present-position measurement unit measures the present position of the magnetic sensor relative to the magnetic-field generation unit based on the direction of the magnetic field measured by the magnetic sensor.

With this configuration, the present-position measurement device according to the present invention measures, based on the direction of the magnetic field measured by the magnetic sensor, the present position of the magnetic sensor relative to the magnetic-field generation unit having generated the magnetic field, and can thus improve the accuracy and speed of the present position measurement compared to conventional systems.

A present-position measurement program according to the present invention causes a computer to implement a present-position measurement unit that measures a present position of a magnetic sensor that measures a direction of a magnetic field generated by a magnetic-field generation unit that generates the magnetic field, in which the present-position measurement unit measures the present position of the magnetic sensor relative to the magnetic-field generation unit based on the direction of the magnetic field measured by the magnetic sensor.

With this configuration, the computer executing the present-position measurement program according to the present invention measures, based on the direction of the magnetic field measured by the magnetic sensor, the present position of the magnetic sensor relative to the magnetic-field generation unit having generated the magnetic field, and can thus improve the accuracy and speed of the present position measurement compared to conventional systems.

A magnetic-field generation device according to the present invention causes a magnetic-field generation unit that generates a magnetic field to generate the magnetic field when authentication of a magnetic sensor that measures a direction of the magnetic field generated by the magnetic-field generation unit has been succeeded.

With this configuration, the magnetic-field generation device according to the present invention causes the magnetic-field generation unit to generate the magnetic field when the authentication of the magnetic sensor has been succeeded, and can thus reduce the possibility of unauthorized use of present position measurement.

A magnetic-field generation program according to the present invention causes a computer to implement a function of causing a magnetic-field generation unit that generates a magnetic field to generate the magnetic field when authentication of a magnetic sensor that measures a direction of the magnetic field generated by the magnetic-field generation unit has been succeeded.

With this configuration, the computer executing the magnetic-field generation program according to the present invention causes the magnetic-field generation unit to generate the magnetic field when the authentication of the magnetic sensor has been succeeded, and can thus reduce the possibility of unauthorized use of present position measurement.

A present-position measurement system, a present-position measurement device, a present-position measurement program, a magnetic-field generation device, and a magnetic-field generation program according to the present invention can improve the accuracy and speed of present position measurement compared to conventional systems.

DETAILED DESCRIPTION

Hereinafter, an embodiment of the present invention will be described with reference to the drawings.

First, a configuration of a present-position measurement system according to an embodiment of the present invention is described.

Figure 1:
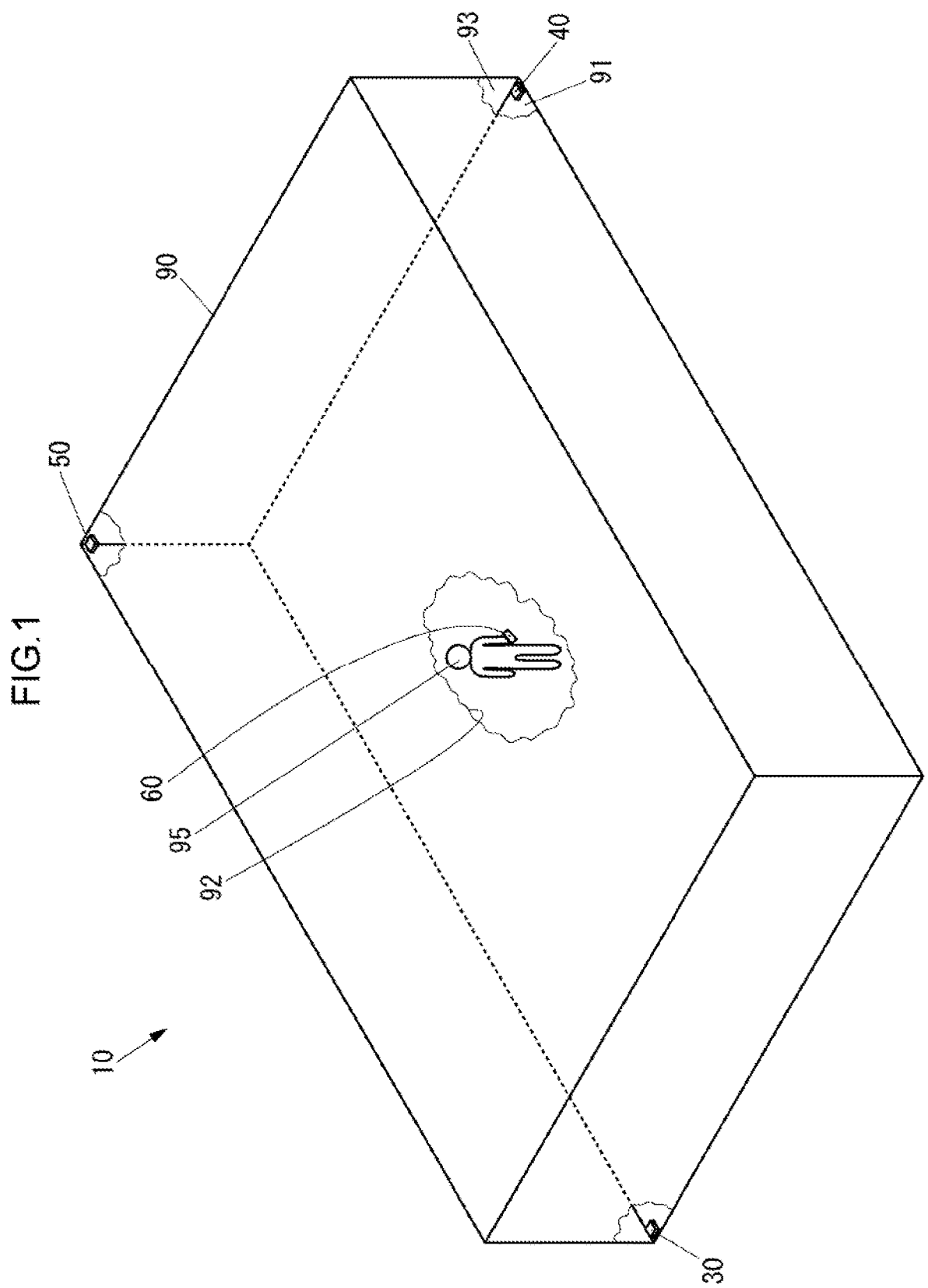
FIG. 1 is a schematic configuration diagram of a present-position measurement system according to an embodiment of the present invention.

FIG. 1 is a schematic configuration diagram of a present-position measurement system 10 according to the present embodiment.

FIG. 1 shows a space 90 that is, for example, an indoor space of about 100 m² in size. The space 90 is surrounded by a floor 91, a ceiling 92, and four side walls 93 disposed between the floor 91 and the ceiling 92. Note that, in order to clearly show a part of the inside of the space 90, a part of a member constituting the ceiling 92 and a part of members constituting the side walls 93 are cut out in FIG. 1.

The present-position measurement system 10 includes magnetic-field generation devices 30, 40, and 50 that each generate a magnetic field, and a magnetic-field measurement device 60 that measures the direction and strength of the magnetic field.

The magnetic-field generation device 30 is installed at one of the four corners of the floor 91. The magnetic-field generation device 40 is installed at one of the four corners of the floor 91 that is the diagonal corner to the corner where the magnetic-field generation device 30 is installed. The magnetic-field generation device 50 is installed at a corner of the ceiling 92 facing at one of the four corners of the floor 91 where neither the magnetic-field generation device 30 nor the magnetic-field generation device 40 is installed. The magnetic-field generation devices 30, 40, and 50 are preferably arranged as far apart from each other as possible in the space 90. The configuration of each of the magnetic-field generation devices 40 and 50 is similar to the configuration of the magnetic-field generation device 30.

Each of the magnetic-field generation devices 30, 40, and 50 is provided with identification information for identifying itself from a plurality of magnetic-field generation devices (hereinafter, referred to as a "generation device ID").

The magnetic-field measurement device 60 is carried by a user 95 in the space 90.

The magnetic-field measurement device 60 is provided with identification information for identifying itself from a plurality of magnetic-field measurement devices (hereinafter, referred to as a "measurement device ID").

Figure 2:
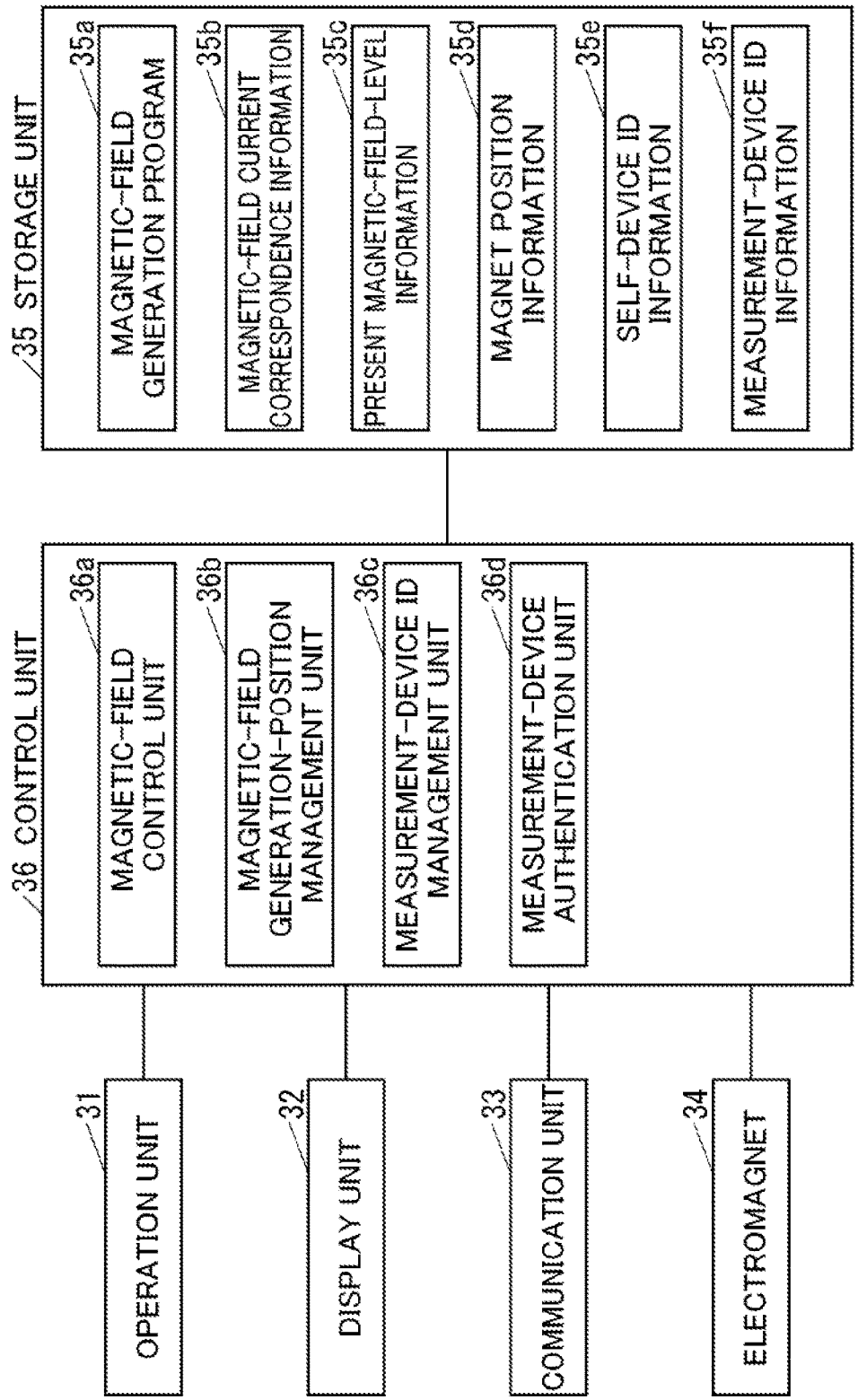
FIG. 2 is a block diagram of a magnetic-field generation device shown in FIG. 1.

FIG. 2 is a block diagram of the magnetic-field generation device 30.

As shown in FIG. 2, the magnetic-field generation device 30 is a computer including an operation unit 31, a display unit 32, a communication unit 33, an electromagnet 34, a storage unit 35, and a control unit 36. The operation unit 31 is an operation device such as a button to which various operations are input. The display unit 32 is a display device such as a liquid crystal display (LCD) that displays various types of information. The communication unit 33 is a communication device that communicates with an external device via a network such as a local area network (LAN) or the Internet or directly in a wired or wireless manner without a network. The electromagnet 34 serves as a magnetic-field generation unit that generates a magnetic field. The storage unit 35 is a non-volatile storage device such as a semiconductor memory that stores various types of information. The control unit 36 controls the entire magnetic-field generation device 30.

The storage unit 35 stores a magnetic-field generation program 35*a* for generating a magnetic field. For example, the magnetic-field generation program 35*a* may be installed in the magnetic-field generation device 30 at the manufacturing stage of the magnetic-field generation device 30, may be additionally installed in the magnetic-field generation device 30 from an external storage medium such as a universal serial bus (USB) memory, or may be additionally installed in the magnetic-field generation device 30 from a network.

The storage unit 35 stores magnetic-field current correspondence information 35*b* indicating the correspondence between the strength level of the magnetic field to be generated by the electromagnet 34 (hereinafter referred to as a "magnetic field level") and the magnitude of the current flowing through the electromagnet 34, and present magnetic-field-level information 35*c* indicating the present magnetic field level. There are five magnetic field levels of 1 to 5, for example.

The storage unit 35 stores magnet position information 35*d* indicating the position of the electromagnet 34 in the space 90, that is, the position of the magnetic-field generation device 30 in the space 90 in three-dimensional coordinates.

The storage unit 35 stores self-device ID information 35*e* indicating the generation device ID of the magnetic-field generation device 30, and measurement-device ID information 35*f* indicating the measurement device ID of a magnetic-field measurement device to be authenticated by the magnetic-field generation device 30.

The control unit 36 includes, for example, a central processing unit (CPU), a read only memory (ROM) that stores programs and various types of data, and a random access memory (RAM) as a memory to be used as a work area of the CPU of the control unit 36. The CPU of the control unit 36 executes a program stored in the storage unit 35 or the ROM of the control unit 36.

By executing the magnetic-field generation program 35*a*, the control unit 36 implements a magnetic-field control unit 36*a*, a magnetic-field generation-position management unit 36*b*, a measurement-device ID management unit 36*c*, and a measurement-device authentication unit 36*d*. The magnetic-field control unit 36*a* controls the generation of the magnetic field by the electromagnet 34. The magnetic-field generation-position management unit 36*b* manages the position of the magnetic-field generation device 30 in the space 90. The measurement-device ID management unit 36*c* manages the measurement device ID of a magnetic-field measurement device to be authenticated by the magnetic-field generation device 30. The measurement-device authentication unit 36*d* authenticates the magnetic-field measurement device.

Figure 3:
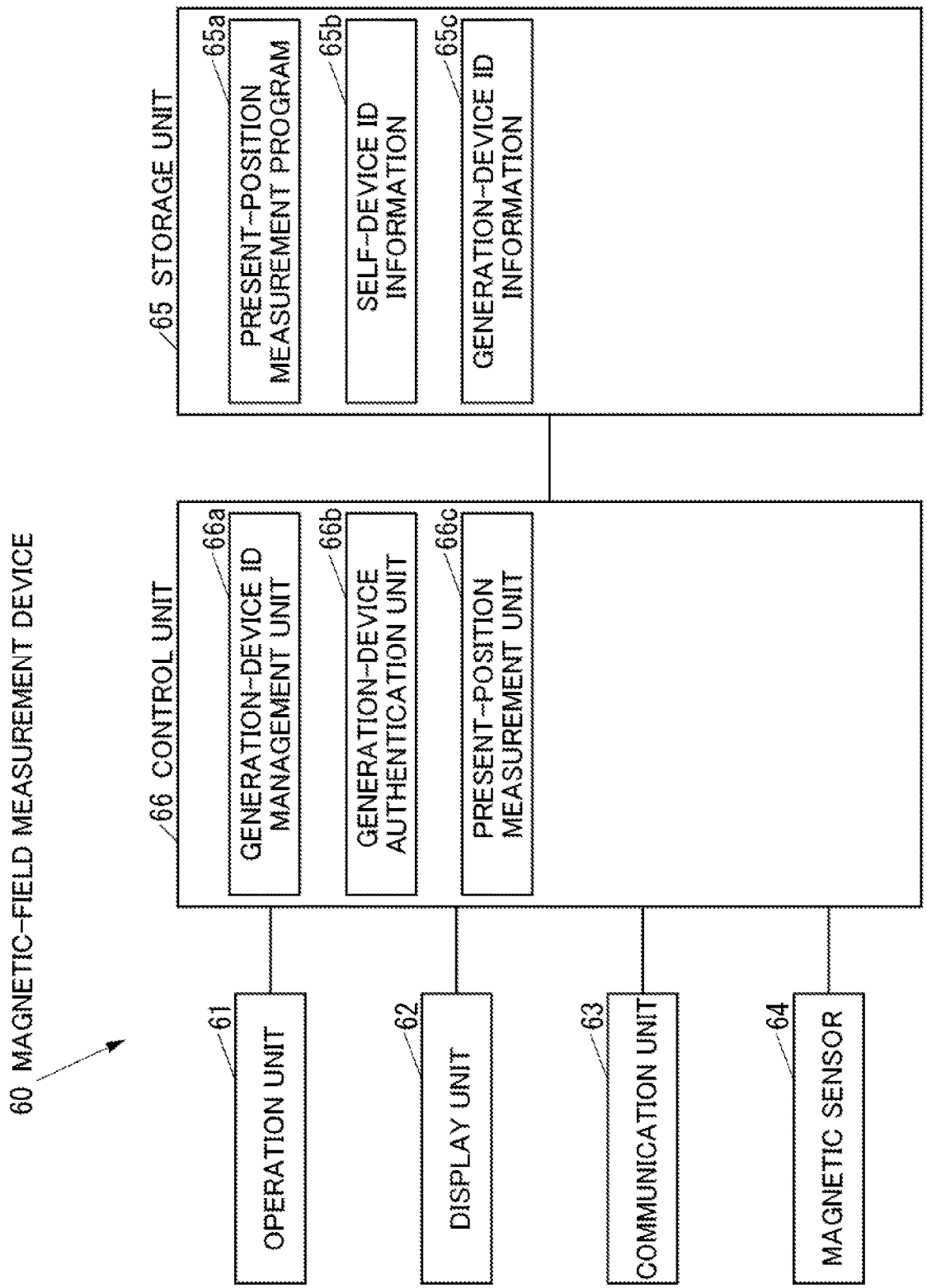
FIG. 3 is a block diagram of a magnetic-field measurement device shown in FIG. 1.

FIG. 3 is a block diagram of the magnetic-field measurement device 60.

As shown in FIG. 3, the magnetic-field measurement device 60 is a computer including an operation unit 61, a display unit 62, a communication unit 63, a magnetic sensor 64, a storage unit 65, and a control unit 66. The operation unit 61 is an operation device such as a button to which various operations are input. The display unit 62 is a display device such as a LCD that displays various types of information. The communication unit 63 is a communication device that communicates with an external device via a network such as a LAN or the Internet or directly in a wired or wireless manner without a network. The magnetic sensor 64 measures the direction and strength of the magnetic field. The storage unit 65 is a non-volatile storage device such as a semiconductor memory that stores various types of information. The control unit 66 controls the entire magnetic-field measurement device 60.

The storage unit 65 stores a present-position measurement program 65*a* for measuring a present position. For example, the present-position measurement program 65*a* may be installed in the magnetic-field measurement device 60 at the manufacturing stage of the magnetic-field measurement device 60, may be additionally installed in the magnetic-field measurement device 60 from an external storage medium such as a USB memory, or may be additionally installed in the magnetic-field measurement device 60 from a network.

The storage unit 65 stores self-device ID information 65*b* indicating the measurement device ID of the magnetic-field measurement device 60, and generation-device ID information 65*c* indicating the generation device ID of a magnetic-field generation device to be authenticated by the magnetic-field measurement device 60.

The control unit 66 includes, for example, a CPU, a ROM that stores programs and various types of data, and a RAM as a memory to be used as a work area of the CPU of the control unit 66. The CPU of the control unit 66 executes a program stored in the storage unit 65 or the ROM of the control unit 66.

By executing the present-position measurement program 65a, the control unit 66 implements a generation-device ID management unit 66a, a generation-device authentication unit 66b, and a present-position measurement unit 66c. The generation-device ID management unit 66a manages the generation device ID of a magnetic-field generation device to be authenticated by the magnetic-field measurement device 60. The generation-device authentication unit 66b authenticates the magnetic-field generation device. The present-position measurement unit 66c measures the present position of the magnetic sensor 64, that is, the present position of the magnetic-field measurement device 60. That is, the magnetic-field measurement device 60 constitutes a present-position measurement device.

Next, an operation of the present-position measurement system 10 is described.

An operation of each of the magnetic-field generation devices 40 and 50 is similar to an operation of the magnetic-field generation device 30. Therefore, the operation of the magnetic-field generation device 30 is described as representative of the operations of the magnetic-field generation devices 30, 40, and 50 in the following description.

First, an operation of the magnetic-field generation device 30 when the strength of a magnetic field is changed is described.

Figure 4:
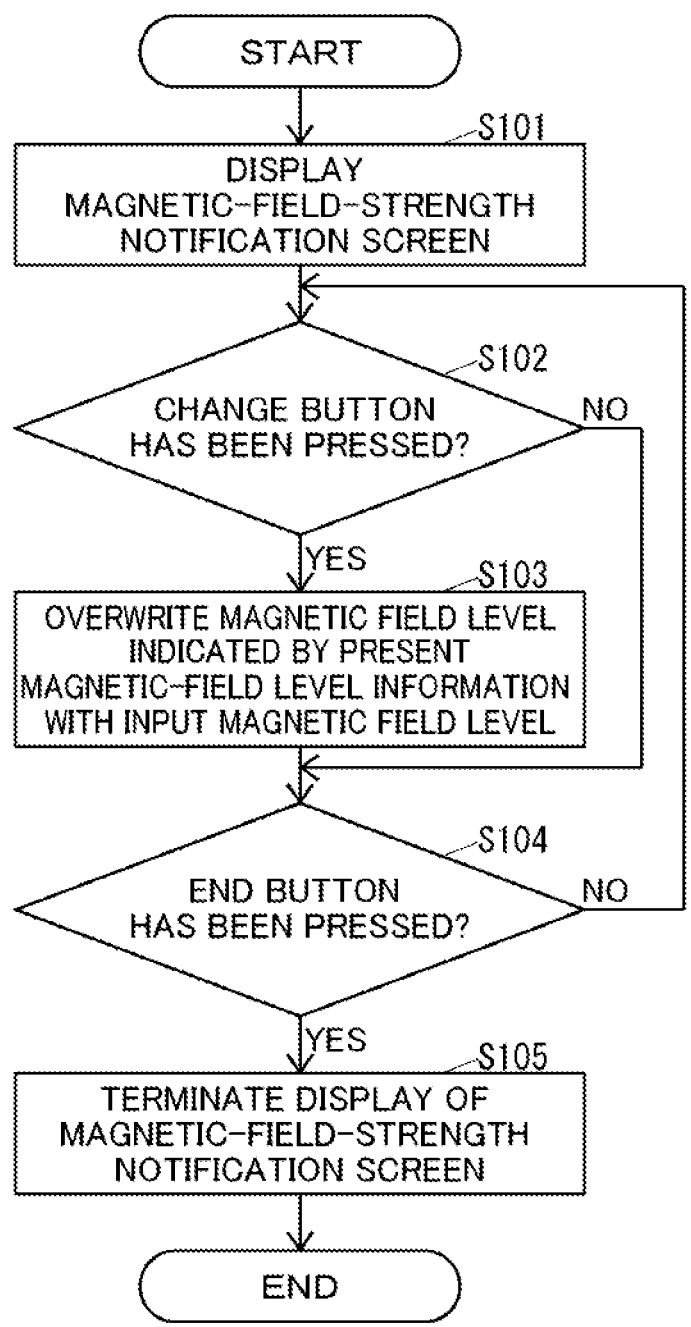
FIG. 4 is a flowchart of an operation of the magnetic-field generation device shown in FIG. 2 when the strength of a magnetic field is changed.

FIG. 4 is a flowchart of the operation of the magnetic-field generation device 30 when the strength of a magnetic field is changed.

The user can instruct the magnetic-field generation device 30 to notify the user of the strength of the present magnetic field through the operation unit 31. When instructed to notify the user of the strength of the present magnetic field, the magnetic-field control unit 36a of the magnetic-field generation device 30 starts the operation shown in FIG. 4.

As shown in FIG. 4, the magnetic-field control unit 36a displays a screen (hereinafter, referred to as a "magnetic-field-strength notification screen") 70 (see FIG. 5) for notifying the user of the strength of the present magnetic field on the display unit 32 (S101).

Figure 5:
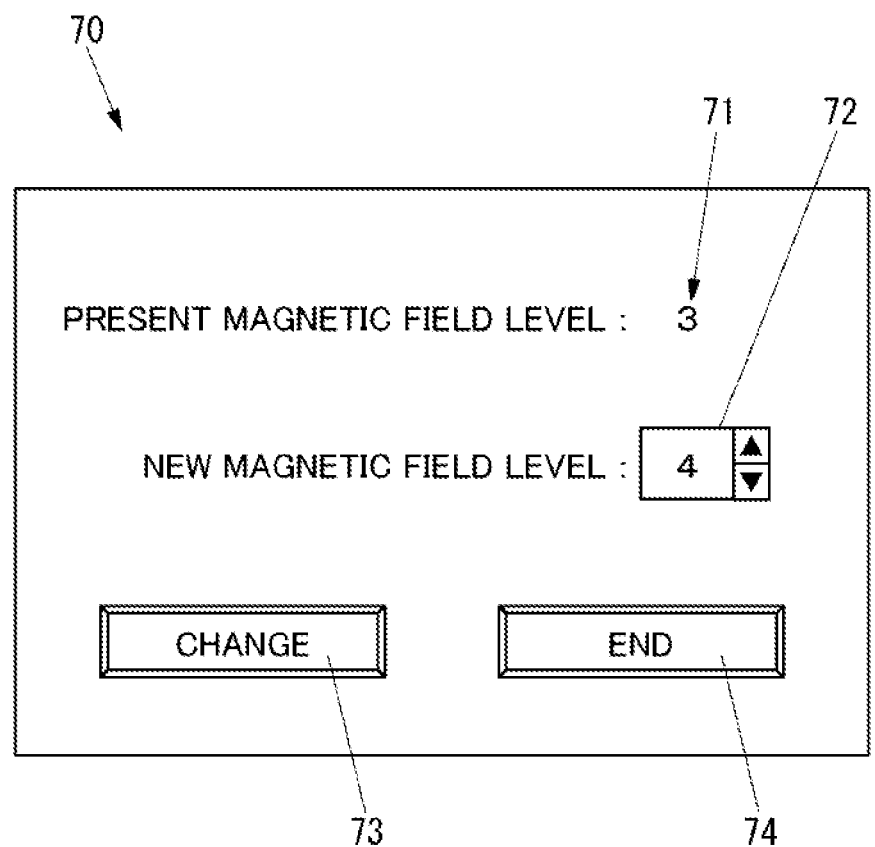
FIG. 5 is a diagram showing an example of a magnetic-field-strength notification screen displayed in the operation shown in FIG. 4.

FIG. 5 is a diagram showing an example of the magnetic-field-strength notification screen 70.

The magnetic-field-strength notification screen 70 shown in FIG. 5 includes a present magnetic-field-level display area 71, a spin box 72, a change button 73, and an end button 74. The present magnetic-field-level display area 71 shows the magnetic field level indicated by the present magnetic-field-level information 35c. The spin box 72 is used to input a new magnetic field level desired by the user. The change button 73 is used to instruct the magnetic-field control unit 36a to change the present magnetic field level to the magnetic field level input to the spin box 72. The end button 74 is used to terminate the display of the magnetic-field-strength notification screen 70.

As shown in FIG. 4, after the processing in S101, the magnetic-field control unit 36a determines whether the change button 73 has been pressed (S102).

When determining in S102 that the change button 73 has been pressed, the magnetic-field control unit 36a overwrites the magnetic field level indicated by the present magnetic-field-level information 35c with the magnetic field level input to the spin box 72 at the time when determining that the change button 73 has been pressed in S102 (S103).

When the magnetic-field control unit 36a determines that the change button 73 has not been pressed in S102, or when the processing in S103 is terminated, the magnetic-field control unit 36a determines whether the end button 74 has been pressed (S104).

When determining that the end button 74 has not been pressed in S104, the magnetic-field control unit 36a performs the processing in S102.

When determining in S104 that the end button 74 has been pressed, the magnetic-field control unit 36a terminates the display of the magnetic-field-strength notification screen 70 on the display unit 32 (S105), and terminates the operation shown in FIG. 4.

With the above operation, the magnetic-field generation device 30 changes the strength of the magnetic field according to the instruction from the user through the operation unit 31. However, the magnetic-field generation device 30 may change the strength of the magnetic field according to an instruction from an external computer operated by the user through the communication unit 33. Here, the external computer may be, for example, the magnetic-field generation device 40 or 50, or the magnetic-field measurement device 60.

Next, an operation of the magnetic-field generation device 30 when the position of the magnetic-field generation device 30 is registered is described.

Figure 6:
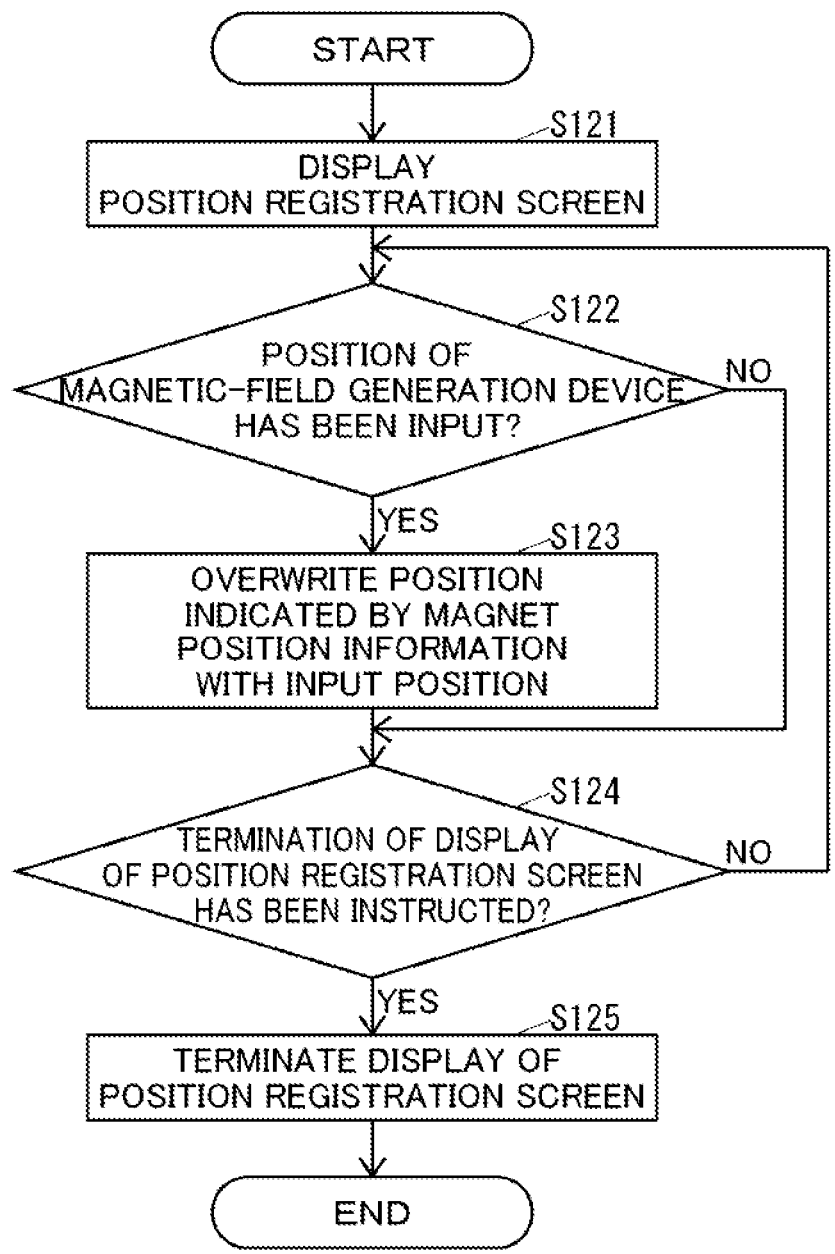
FIG. 6 is a flowchart of an operation of the magnetic-field generation device shown in FIG. 2 when the position of the magnetic-field generation device is registered.

FIG. 6 is a flowchart of the operation of the magnetic-field generation device 30 when the position of the magnetic-field generation device 30 is registered.

The user can instruct the magnetic-field generation device 30 to start processing for registering the position of the magnetic-field generation device 30 through the operation unit 31. When instructed to start the processing for registering the position of the magnetic-field generation device 30, the magnetic-field generation-position management unit 36b of the magnetic-field generation device 30 starts the operation shown in FIG. 6.

As shown in FIG. 6, the magnetic-field generation-position management unit 36b displays a screen (hereinafter, referred to as a "position registration screen") for registering the position of the magnetic-field generation device 30 on the display unit 32 (S121). The user can input the position of the magnetic-field generation device 30 in the space 90 to the position registration screen through the operation unit 31. In addition, the user can instruct, on the position registration screen through the operation unit 31, termination of the display of the position registration screen.

After the processing in S121, the magnetic-field generation-position management unit 36b determines whether the position of the magnetic-field generation device 30 in the space 90 has been input to the position registration screen (S122).

When determining in S122 that the position of the magnetic-field generation device 30 in the space 90 has been input to the position registration screen, the magnetic-field generation-position management unit 36b overwrites the position of the magnetic-field generation device 30 indicated by the magnet position information 35d with the position input to the position registration screen (S123).

When the magnetic-field generation-position management unit 36b determines in S122 that the position of the magnetic-field generation device 30 in the space 90 has not been input to the position registration screen, or when the processing in S123 is terminated, the magnetic-field generation-position management unit 36b determines whether termination of the display of the position registration screen has been instructed on the position registration screen (S124).

When determining in S124 that termination of the display of the position registration screen has not been instructed on the position registration screen, the magnetic-field generation-position management unit 36b performs the processing in S122.

When determining in S124 that termination of the display of the position registration screen has been instructed on the position registration screen, the magnetic-field generation-position management unit 36b terminates the display of the position registration screen on the display unit 32 (S125), and terminates the operation shown in FIG. 6.

With the above operation, the magnetic-field generation device 30 registers the position of the magnetic-field generation device 30 according to the instruction from the user through the operation unit 31. However, the magnetic-field generation device 30 may register the position of the magnetic-field generation device 30 according to an instruction from an external computer operated by the user through the communication unit 33. Here, the external computer may be, for example, the magnetic-field generation device 40 or 50, or the magnetic-field measurement device 60.

Next, an operation of the magnetic-field generation device 30 when a measurement device ID of a magnetic-field measurement device to be authenticated by the magnetic-field generation device 30 is registered is described.

Figure 7:
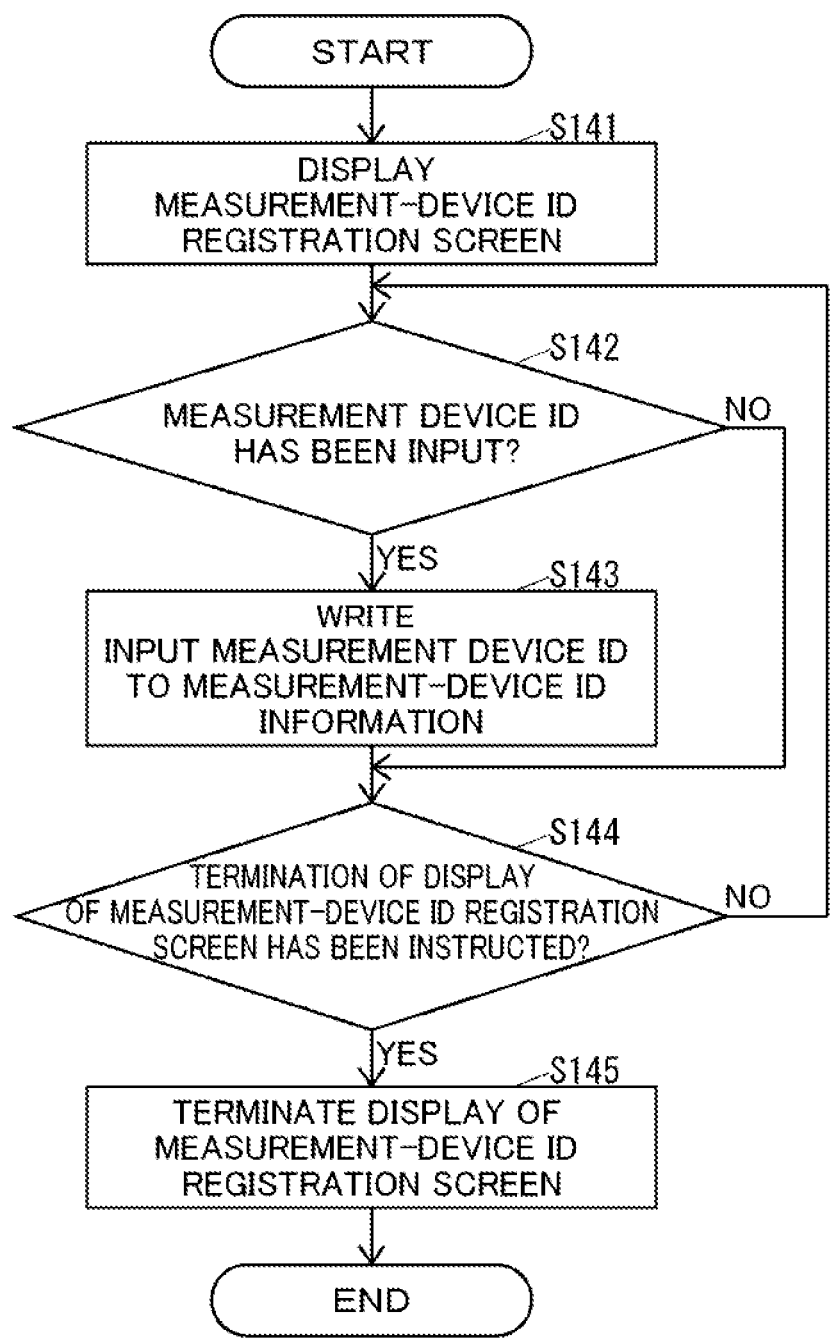
FIG. 7 is a flowchart of an operation of the magnetic-field generation device shown in FIG. 2 when a measurement device ID of the magnetic-field measurement device to be authenticated by the magnetic-field generation device is registered.

FIG. 7 is a flowchart of the operation of the magnetic-field generation device 30 when the measurement device ID of the magnetic-field measurement device to be authenticated by the magnetic-field generation device 30 is registered.

The user can instruct the magnetic-field generation device 30 to start processing for registering the measurement device ID through the operation unit 31. When instructed to start the processing for registering the measurement device ID, the measurement-device ID management unit 36c of the magnetic-field generation device 30 starts the operation shown in FIG. 7.

As shown in FIG. 7, the measurement-device ID management unit 36c displays a screen (hereinafter, referred to as a "measurement-device ID registration screen") for registering the measurement device ID on the display unit 32 (S141). The user can input the measurement device ID of the magnetic-field measurement device that the user desires to have the magnetic-field generation device 30 authenticate to the measurement-device ID registration screen through the operation unit 31. In addition, the user can instruct, on the measurement-device ID registration screen through the operation unit 31, termination of the display of the measurement-device ID registration screen.

After the processing in S141, the measurement-device ID management unit 36c determines whether the measurement device ID has been input to the measurement-device ID registration screen (S142).

When determining in S142 that the measurement device ID has been input to the measurement-device ID registration screen, the measurement-device ID management unit 36c writes the measurement device ID input to the measurement-device ID registration screen in the measurement-device ID information 35f (S143).

When the measurement-device ID management unit 36c determines in S142 that the measurement device ID has not been input to the measurement-device ID registration screen, or when the processing in S143 is terminated, the measurement-device ID management unit 36c determines whether termination of the display of the measurement-device ID registration screen has been instructed on the measurement-device ID registration screen (S144).

When determining in S144 that termination of the display of the measurement-device ID registration screen has not been instructed on the measurement-device ID registration screen, the measurement-device ID management unit 36c performs the processing in S142.

When determining in S144 that termination of the display of the measurement-device ID registration screen has been instructed on the measurement-device ID registration screen, the measurement-device ID management unit 36c terminates the display of the measurement-device ID registration screen on the display unit 32 (S145), and terminates the operation shown in FIG. 7.

With the above operation, the magnetic-field generation device 30 registers the measurement device ID according to the instruction from the user through the operation unit 31. However, the magnetic-field generation device 30 may register the measurement device ID according to an instruction from an external computer operated by the user through the communication unit 33. Here, the external computer may be, for example, the magnetic-field generation device 40 or 50, or the magnetic-field measurement device 60.

Next, an operation of the magnetic-field measurement device 60 when a generation device ID of a magnetic-field generation device to be authenticated by the magnetic-field measurement device 60 is registered is described.

Figure 8:
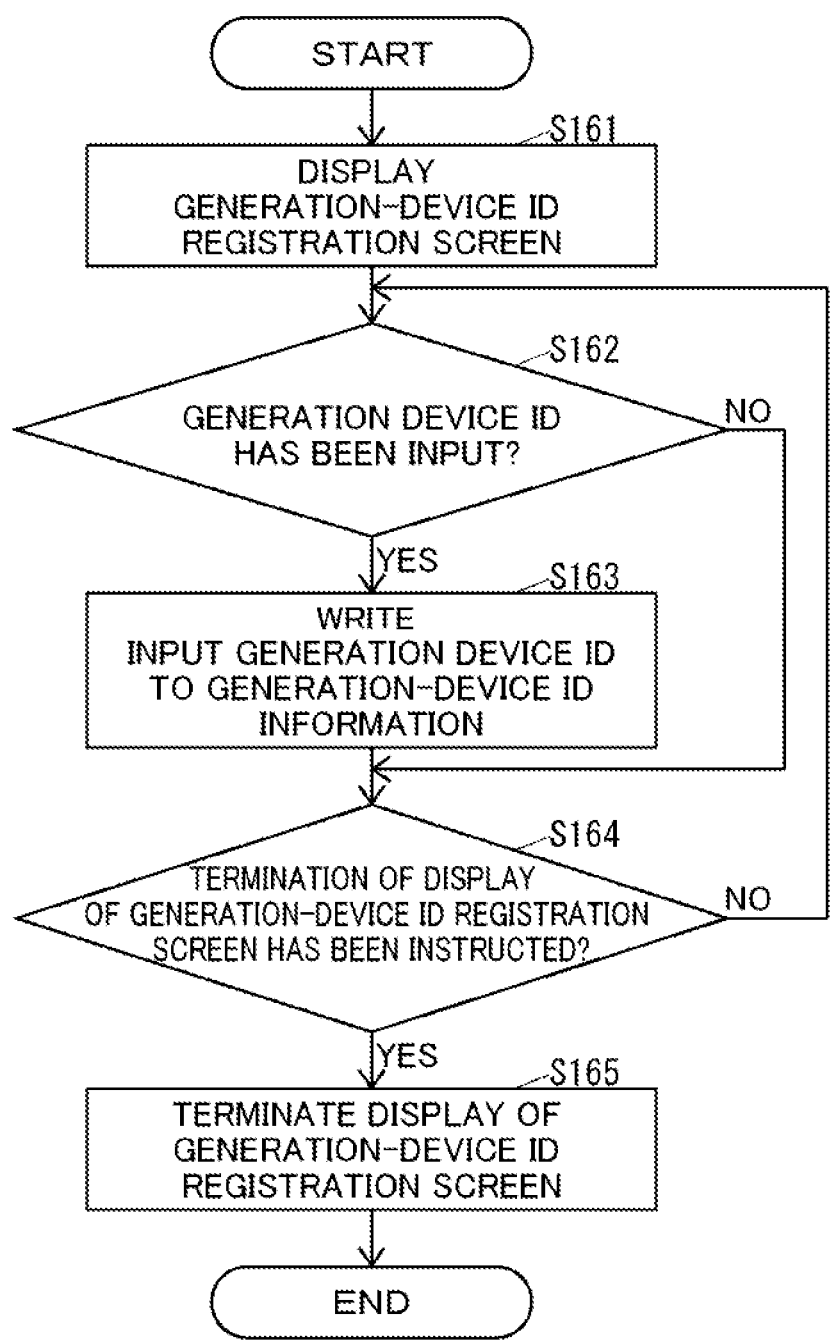
FIG. 8 is a flowchart of an operation of the magnetic-field measurement device shown in FIG. 3 when a generation device ID of the magnetic-field generation device to be authenticated by the magnetic-field measurement device is registered.

FIG. 8 is a flowchart of the operation of the magnetic-field measurement device 60 when the generation device ID of the magnetic-field generation device to be authenticated by the magnetic-field measurement device 60 is registered.

The user can instruct the magnetic-field measurement device 60 to start processing for registering the generation device ID through the operation unit 61. When instructed to start the processing for registering the generation device ID, the generation-device ID management unit 66a of the magnetic-field measurement device 60 starts the operation shown in FIG. 8.

As shown in FIG. 8, the generation-device ID management unit 66a displays a screen (hereinafter, referred to as a "generation-device ID registration screen") for registering a generation device ID on the display unit 62 (S161). The user can input the generation device ID of the magnetic-field generation device that the user desires to have the magnetic-field measurement device 60 authenticate to the generation-device ID registration screen through the operation unit 61. In addition, the user can instruct, on the generation-device ID registration screen through the operation unit 61, termination of the display of the generation-device ID registration screen.

After the processing in S161, the generation-device ID management unit 66a determines whether the generation device ID has been input to the generation-device ID registration screen (S162).

When determining in S162 that the generation device ID has been input to the generation-device ID registration screen, the generation-device ID management unit 66a writes the generation device ID input to the generation-device ID registration screen in the generation-device ID information 65c (S163).

When the generation-device ID management unit 66a determines in S162 that the generation device ID has not been input to the generation-device ID registration screen, or when the processing in S163 is terminated, the generation-device ID management unit 66a determines whether termination of the display of the generation-device ID registration screen has been instructed on the generation-device ID registration screen (S164).

When determining in S164 that termination of the display of the generation-device ID registration screen has not been instructed on the generation-device ID registration screen, the generation-device ID management unit 66a performs the processing in S162.

When determining in S164 that termination of the display of the generation-device ID registration screen has been instructed on the generation-device ID registration screen, the generation-device ID management unit 66a terminates the display of the generation-device ID registration screen on the display unit 62 (S165), and terminates the operation shown in FIG. 8.

With the above operation, the magnetic-field measurement device 60 registers the generation device ID according to the instruction from the user through the operation unit 61. However, the magnetic-field measurement device 60 may register the generation device ID according to an instruction from an external computer operated by the user through the communication unit 63. Here, the external computer may be, for example, the magnetic-field generation device 30, 40, or 50.

Next, an operation of the present-position measurement system 10 when the magnetic-field generation device 30 and the magnetic-field measurement device 60 authenticate each other is described.

Figure 9:
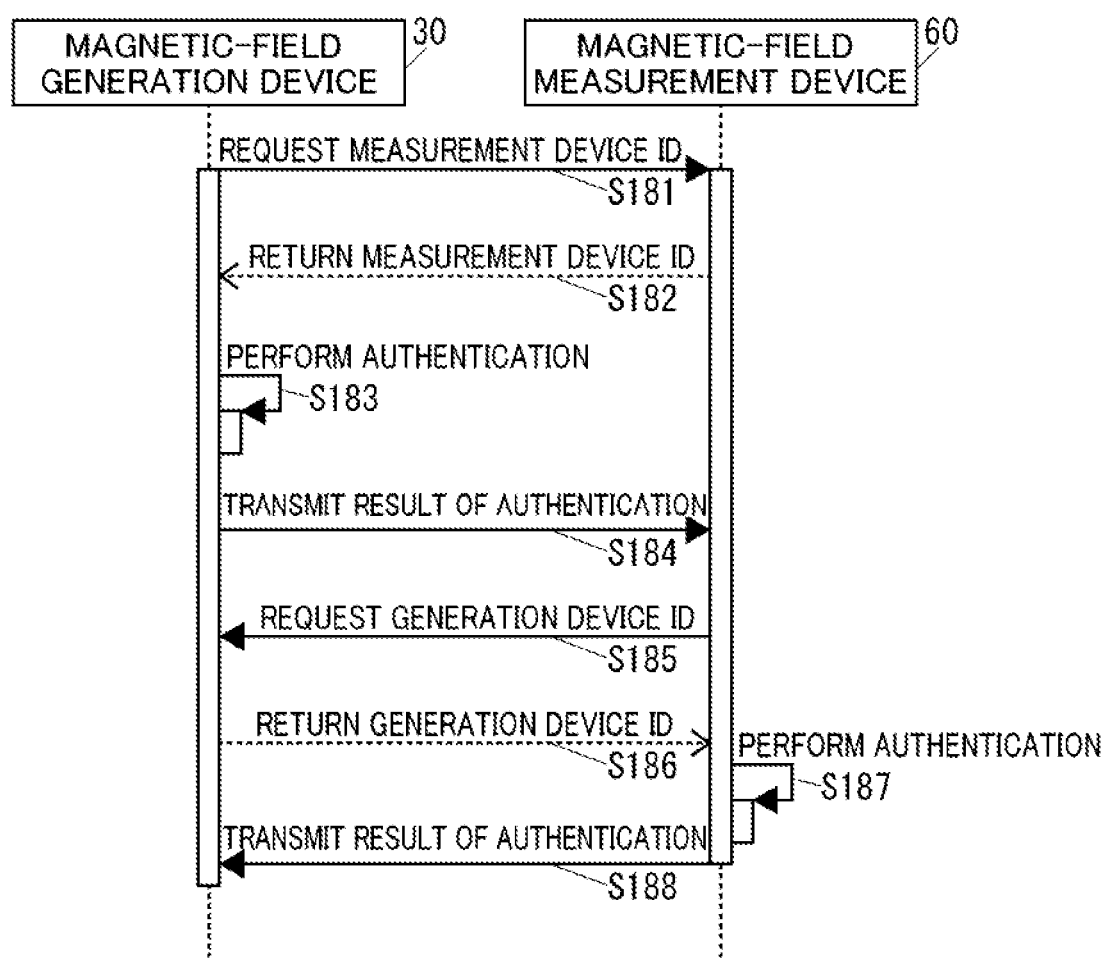
FIG. 9 is a sequence diagram of an operation of the present-position measurement system shown in FIG. 1 when the magnetic-field generation device and the magnetic-field measurement device authenticate each other.

FIG. 9 is a sequence diagram of the operation of the present-position measurement system 10 when the magnetic-field generation device 30 and the magnetic-field measurement device 60 authenticate each other.

When the magnetic-field measurement device 60 approaches the magnetic-field generation device 30 and the magnetic-field generation device 30 and the magnetic-field measurement device 60 can communicate with each other using specific short-range wireless communication such as Bluetooth (registered trademark) or Wi-Fi, the magnetic-field generation device 30 and the magnetic-field measurement device 60 perform the operation shown in FIG. 9. In the operation shown in FIG. 9, the magnetic-field generation device 30 and the magnetic-field measurement device 60 communicate with each other using the specific short-range wireless communication.

As shown in FIG. 9, the measurement-device authentication unit 36d of the magnetic-field generation device 30 requests the measurement device ID of the magnetic-field measurement device 60 from the magnetic-field measurement device 60 (S181).

When receiving the request in S181, the generation-device authentication unit 66b of the magnetic-field measurement device 60 returns the measurement device ID indicated by the self-device ID information 65b to the magnetic-field generation device 30 (S182).

When receiving the reply in S182, the measurement-device authentication unit 36d of the magnetic-field generation device 30 authenticates the magnetic-field measurement device 60 (S183). Here, when the measurement device ID returned in S182 is included in the measurement-device ID information 35f, the measurement-device authentication unit 36d determines that the authentication of the magnetic-field measurement device 60 has been succeeded. On the other hand, when the measurement device ID returned in S182 is not included in the measurement-device ID information 35f, the measurement-device authentication unit 36d determines that the authentication of the magnetic-field measurement device 60 has been failed.

After the processing in S183, the measurement-device authentication unit 36d of the magnetic-field generation device 30 transmits the result of the authentication in S183 to the magnetic-field measurement device 60 (S184).

The generation-device authentication unit 66b of the magnetic-field measurement device 60 requests the generation device ID of the magnetic-field generation device 30 from the magnetic-field generation device 30 (S185).

When receiving the request in S185, the measurement-device authentication unit 36d of the magnetic-field generation device 30 returns the generation device ID indicated by the self-device ID information 35e to the magnetic-field measurement device 60 (S186).

When receiving the reply in S186, the generation-device authentication unit 66b of the magnetic-field measurement device 60 authenticates the magnetic-field generation device 30 (S187). Here, when the generation device ID returned in S186 is included in the generation-device ID information 65c, the generation-device authentication unit 66b determines that the authentication of the magnetic-field generation device 30 has been succeeded. On the other hand, when the generation device ID returned in S186 is not included in the generation-device ID information 65c, the generation-device authentication unit 66b determines that the authentication of the magnetic-field generation device 30 has been failed.

After the processing in S187, the generation-device authentication unit 66b of the magnetic-field measurement device 60 transmits the result of the authentication in S187 to the magnetic-field generation device 30 (S188).

Note that S185 may be performed before any of S181 to S184. S186 may be performed before any of S181 to S184 as long as it is performed after S185. S187 may be performed before any of S181 to S184 as long as it is performed after S186. S188 may be performed before any of S181 to S184 as long as it is performed after S187.

Next, an operation of the magnetic-field generation device 30 when the magnetic field is generated is described.

Figure 10:
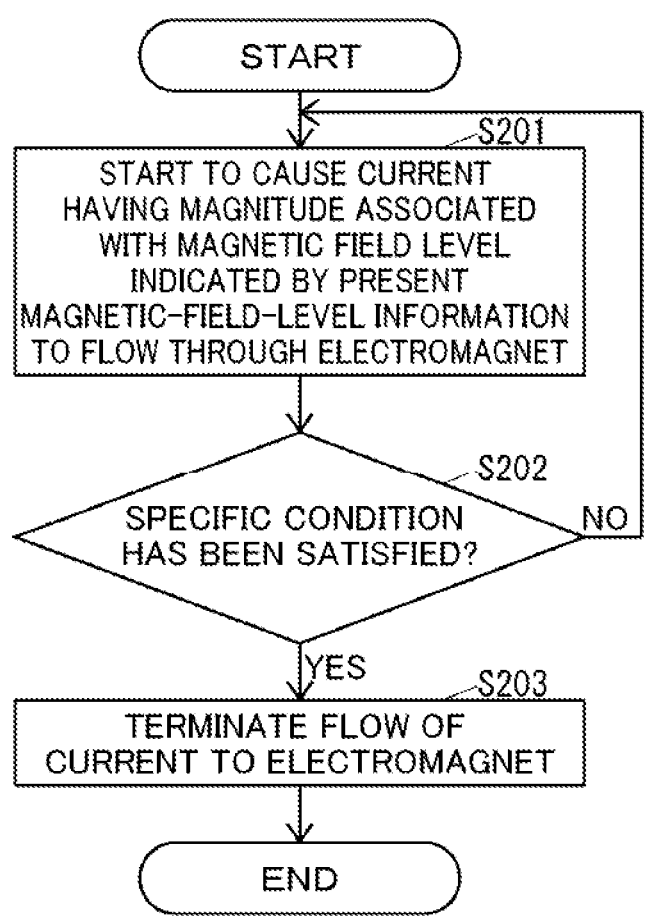
FIG. 10 is a flowchart of an operation of the magnetic-field generation device shown in FIG. 2 when a magnetic field is generated.

FIG. 10 is a flowchart of the operation of the magnetic-field generation device 30 when the magnetic field is generated.

When the authentication in S183 is succeeded and the result of the successful authentication is transmitted in S188, the magnetic-field control unit 36a of the magnetic-field generation device 30 performs the operation shown in FIG. 10. Here, the successful authentication in S183 means that the authentication of the magnetic-field measurement device 60 has been succeeded. In addition, the fact that the successful authentication of the magnetic-field generation device 30 has been transmitted in S188 from the magnetic-field measurement device 60 to which the magnetic-field generation device 30 has transmitted its own generation device ID in S186 also means that the authentication of the magnetic-field measurement device 60 has been succeeded.

As shown in FIG. 10, the magnetic-field control unit 36a of the magnetic-field generation device 30 starts to cause a current having a magnitude associated in the magnetic-field current correspondence information 35b with the magnetic field level indicated by the present magnetic-field-level information 35c to flow through the electromagnet 34 (S201). Therefore, the electromagnet 34 generates a magnetic field corresponding to the magnitude of the current flowing through the electromagnet 34.

Figure 11:
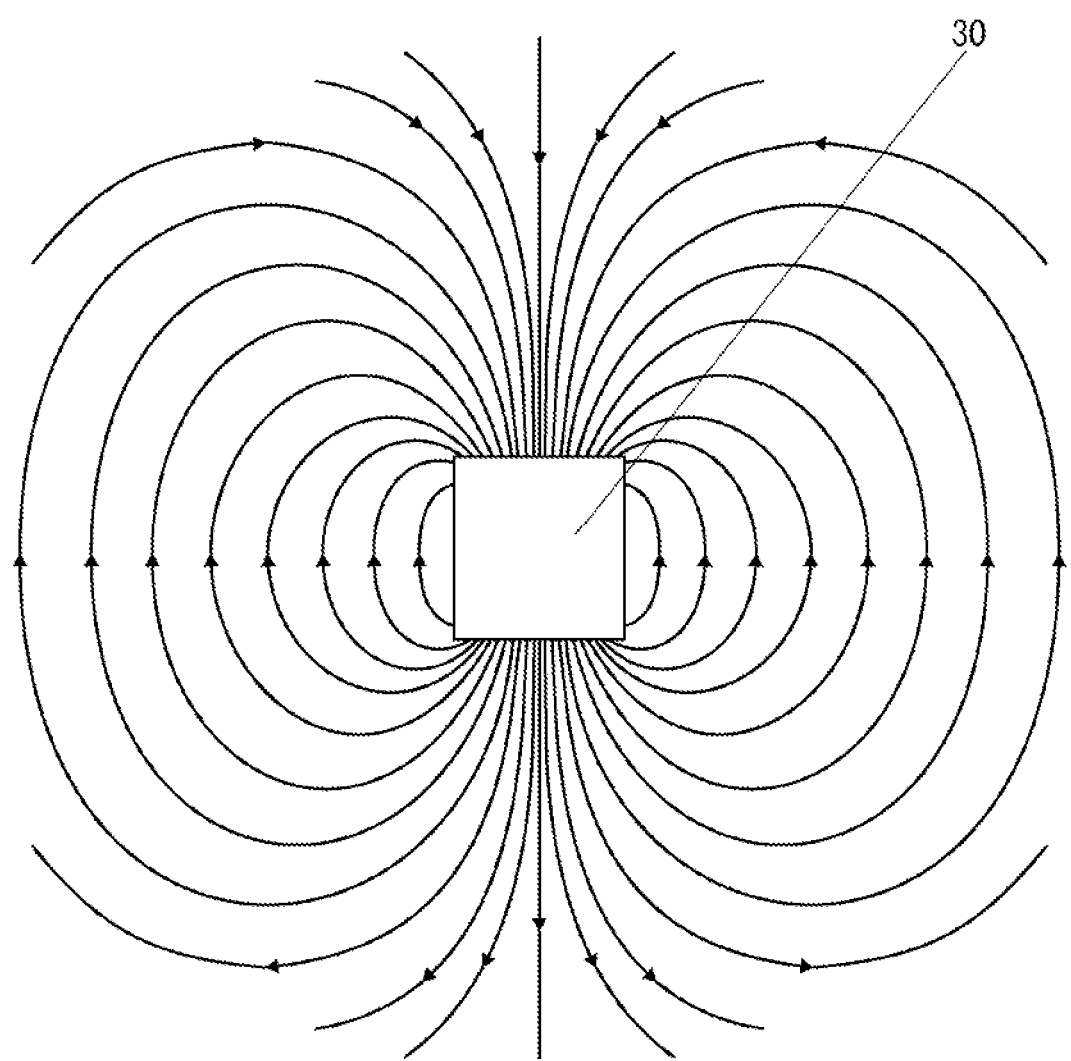
FIG. 11 is a schematic diagram of a magnetic field generated by the magnetic-field generation device shown in FIG. 2.

FIG. 11 is a schematic diagram of a magnetic field generated by the magnetic-field generation device 30.

When the electromagnet 34 of the magnetic-field generation device 30 generates a magnetic field, the magnetic field is around the electromagnet 34 in an arc as shown in FIG. 11. Note that, in FIG. 11, the magnetic field is drawn in a flat plane, but the magnetic field actually is around the electromagnet 34 in a three-dimensionally arc.

As shown in FIG. 10, after the processing in S201, the magnetic-field control unit 36*a* determines whether a specific condition has been satisfied (S202). Here, the specific condition is, for example, a condition that the magnetic-field generation device 30 and the magnetic-field measurement device 60 cannot communicate with each other using the specific short-range wireless communication.

When determining that the specific condition has not been satisfied in S202, the magnetic-field control unit 36*a* performs the processing in S201.

When determining in S202 that the specific condition has been satisfied, the magnetic-field control unit 36*a* terminates the flow of current to the electromagnet 34 (S203), and terminates the operation shown in FIG. 10.

Next, an operation of the magnetic-field measurement device 60 when a present position is measured is described.

Figure 12:
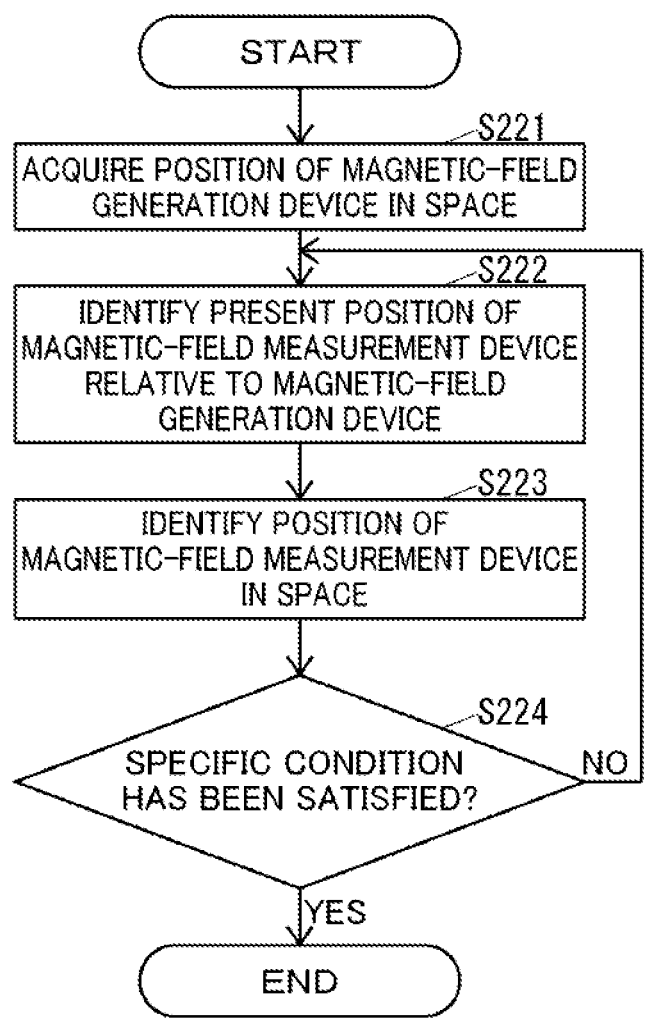
FIG. 12 is a flowchart of an operation of the magnetic-field measurement device shown in FIG. 3 when a present position is measured.

FIG. 12 is a flowchart of the operation of the magnetic-field measurement device 60 when the present position is measured.

When the authentication in S187 is succeeded and the result of the successful authentication is transmitted in S184, the present-position measurement unit 66*c* of the magnetic-field measurement device 60 performs the operation shown in FIG. 12. Here, the successful authentication in S187 means that the authentication of the magnetic-field generation device 30 has been succeeded. In addition, the fact that the successful authentication of the magnetic-field measurement device 60 has been transmitted in S184 from the magnetic-field generation device 30 to which the magnetic-field measurement device 60 has transmitted its own measurement device ID in S182 also means that the authentication of the magnetic-field generation device 30 has been succeeded.

As shown in FIG. 12, the present-position measurement unit 66*c* acquires the positions of the magnetic-field generation devices 30, 40, and 50 in the space 90 from the magnetic-field generation devices 30, 40, and 50, respectively (S221). Here, when the position of the magnetic-field generation device 30 in the space 90 is requested from the magnetic-field measurement device 60, the magnetic-field generation-position management unit 36*b* of the magnetic-field generation device 30 returns the position indicated by the magnet position information 35*d* to the magnetic-field measurement device 60. Each of the magnetic-field generation devices 40 and 50 operates similarly to the magnetic-field generation device 30.

After the processing in S221, the present-position measurement unit 66*c* of the magnetic-field measurement device 60 identifies, based on the direction of the magnetic field measured by the magnetic sensor 64, the present position of the magnetic sensor 64 relative to the magnetic-field generation device generating the magnetic field, that is, the present position of the magnetic-field measurement device 60 relative to the magnetic-field generation device in three-dimensional coordinates (S222). That is, the present-position measurement unit 66*c* measures the present position of the magnetic-field measurement device 60 relative to the magnetic-field generation device.

Figure 13:
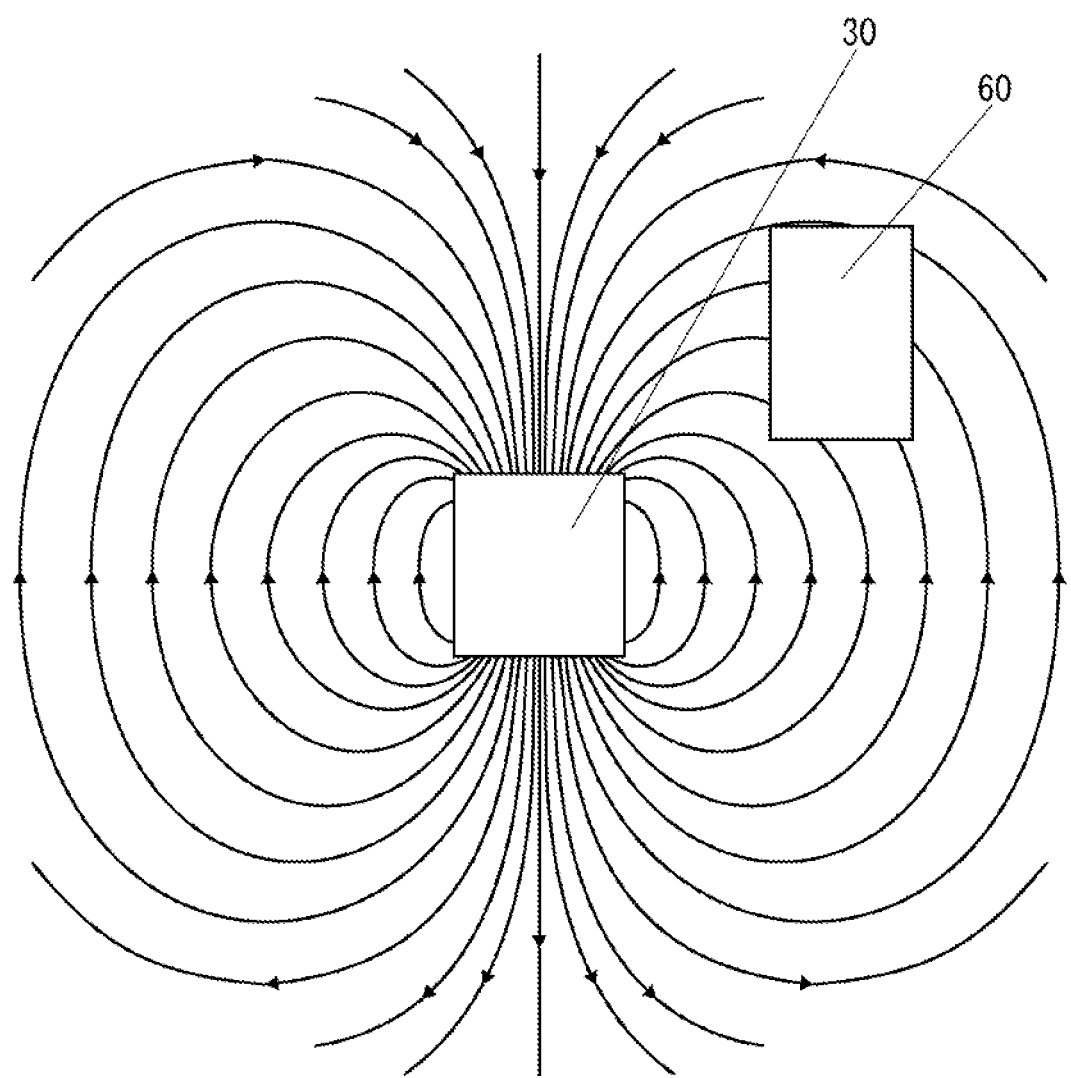
FIG. 13 is a schematic diagram showing that the magnetic-field measurement device is in the magnetic field generated by the magnetic-field generation device shown in FIG. 2.

FIG. 13 is a schematic diagram showing that the magnetic-field measurement device 60 is in the magnetic field generated by the magnetic-field generation device 30.

Since the magnetic field is around the electromagnet 34 of the magnetic-field generation device 30 in such a manner as to three-dimensionally draw an arc as shown in FIG. 11, the direction of the magnetic field measured by the magnetic sensor 64 of the magnetic-field measurement device 60 varies depending on the present position of the magnetic-field measurement device 60 relative to the magnetic-field generation device 30 as shown in FIG. 13. Thus, the present-position measurement unit 66*c* can identify, based on the direction of the magnetic field measured by the magnetic sensor 64, the position of the electromagnet of the magnetic-field generation device generating the magnetic field, relative to the magnetic sensor 64 in three-dimensional coordinates. Note that, in FIG. 13, the magnetic field is drawn in a flat plane, but the magnetic field actually is around the electromagnet 34 in a three-dimensionally arc.

Note that the present-position measurement unit 66*c* can improve the accuracy of the position identified in S222 by considering the strength of the magnetic field measured by the magnetic sensor 64 in addition to the direction of the magnetic field measured by the magnetic sensor 64.

As shown in FIG. 12, after the processing in S222, the present-position measurement unit 66*c* identifies, based on the positions of the magnetic-field generation devices 30, 40, and 50 in the space 90 acquired in S221 and the present position of the magnetic-field measurement device 60 relative to the magnetic-field generation devices identified in S222, the present position of the magnetic sensor 64 in the space 90, that is, the present position of the magnetic-field measurement device 60 in the space 90 (S223). That is, the present-position measurement unit 66*c* measures the present position of the magnetic-field measurement device 60 in the space 90. Here, the present position is expressed in three-dimensional coordinates.

After the processing in S223, the present-position measurement unit 66*c* determines whether the specific condition has been satisfied (S224). Here, the specific condition is, for example, a condition that the magnetic-field generation device 30 and the magnetic-field measurement device 60 cannot communicate with each other using the specific short-range wireless communication.

When determining that the specific condition has not been satisfied in S224, the present-position measurement unit 66*c* performs the processing in S222.

When determining that the specific condition has been satisfied in S224, the present-position measurement unit 66*c* terminates the operation shown in FIG. 12.

As described above, the present-position measurement system 10 measures, based on the direction of the magnetic field measured by the magnetic sensor 64, the present position of the magnetic-field measurement device 60 relative to the magnetic-field generation device having generated the magnetic field (S222), and can thus improve the accuracy and speed of the present position measurement compared to conventional systems.

The present-position measurement system 10 measures the present position of the magnetic-field measurement device 60 relative to the magnetic-field generation devices 30, 40, and 50 arranged apart from each other, and can thus improve the accuracy of the present position measurement.

In the present embodiment, the present-position measurement system 10 includes the three magnetic-field generation devices 30, 40, and 50. However, the number of magnetic-field generation devices included in the present-position measurement system 10 may be other than three. For example, the present-position measurement system 10 may include only one magnetic-field generation device, two magnetic-field generation devices, or four or more magnetic-field generation devices. If the present-position measurement system 10 includes three magnetic-field generation devices, the accuracy of the present position measurement can be improved as compared to the case of including only one magnetic-field generation device or two magnetic-field generation devices.

The present-position measurement system 10 measures the present position of the magnetic-field measurement device 60 in the space 90 based on the position of the magnetic-field generation device in the space 90 managed by the magnetic-field generation-position management unit and the present position of the magnetic-field measurement device 60 relative to the magnetic-field generation device (S223), and can thus improve the accuracy and speed of the present position measurement by the magnetic-field measurement device 60 in the space 90 as compared to conventional systems.

In the present embodiment, the present-position measurement system 10 measures the present position of the magnetic-field measurement device 60 in the space 90 based on the position of the magnetic-field generation device in the space 90 managed by the magnetic-field generation-position management unit and the present position of the magnetic-field measurement device 60 relative to the magnetic-field generation device. However, the present-position measurement system 10 may only measure the present position of the magnetic-field measurement device 60 relative to the magnetic-field generation device and may not measure the present position of the magnetic-field measurement device 60 in the space 90. If the present position of the magnetic-field measurement device 60 in the space 90 is not measured, the present-position measurement system 10 may not include the magnetic-field generation-position management unit.

When the authentication in S187 is succeeded and the successful authentication is transmitted from the magnetic-field generation device 30 to the magnetic-field measurement device 60 in S184, that is, when the authentication of the magnetic-field generation device 30 has been succeeded, the magnetic-field measurement device 60 measures the present position of the magnetic-field measurement device 60 (S221 to S224), and the present-position measurement system 10 can thus reduce the possibility of unauthorized use of the present position measurement.

In the present embodiment, the magnetic-field measurement device 60 adopts a condition that the authentication in S187 has been succeeded and the successful authentication has been transmitted in S184 as a condition for starting the operation shown in FIG. 12. However, the magnetic-field measurement device 60 may adopt, as the condition for starting the operation shown in FIG. 12, either a condition that the authentication in S187 has been succeeded or a condition that the successful authentication has been transmitted in S184. If the magnetic-field measurement device 60 adopts the condition that the authentication in S187 has been succeeded as the condition for starting the operation shown in FIG. 12, the magnetic-field generation device 30 may not transmit the result of the authentication in S183 to the magnetic-field measurement device 60.

In the present embodiment, when the authentication of the magnetic-field generation device has been succeeded, the magnetic-field measurement device 60 measures the present position of the magnetic-field measurement device 60 (S221 to S224). However, the magnetic-field measurement device 60 may measure the present position of the magnetic-field measurement device 60 regardless of whether the authentication of the magnetic-field generation device is succeeded. If the magnetic-field measurement device 60 measures the present position of the magnetic-field measurement device 60 regardless of whether the authentication of the magnetic-field generation device is succeeded, the magnetic-field generation device 30 may not transmit the result of the authentication of the magnetic-field measurement device 60 to the magnetic-field measurement device 60, and the magnetic-field measurement device 60 may not authenticate the magnetic-field generation device 30.

When the authentication in S183 is succeeded and the successful authentication is transmitted from the magnetic-field measurement device 60 to the magnetic-field generation device 30 in S188, that is, when the authentication of the magnetic-field measurement device 60 has been succeeded, the magnetic-field generation device 30 causes the electromagnet 34 to generate the magnetic field (S201 to S203), and the present-position measurement system 10 can thus reduce the possibility of unauthorized use of the present position measurement.

In the present embodiment, the magnetic-field generation device 30 adopts a condition that authentication in S183 has been succeeded and the successful authentication has been transmitted in S188 as a condition for starting the operation shown in FIG. 10. However, the magnetic-field generation device 30 may adopt, as the condition for starting the operation shown in FIG. 10, either a condition that the authentication in S183 has been succeeded or a condition that the successful authentication has been transmitted in S188. If the magnetic-field generation device 30 adopts the condition that the authentication in S183 has been succeeded as the condition for starting the operation shown in FIG. 10, the magnetic-field measurement device 60 may not transmit the result of the authentication in S187 to the magnetic-field generation device 30.

In the present embodiment, when the authentication of the magnetic-field measurement device 60 has been succeeded, the magnetic-field generation device 30 causes the electromagnet 34 to generate the magnetic field (S201 to S203). However, the magnetic-field generation device 30 may cause the electromagnet 34 to generate the magnetic field regardless of whether the authentication of the magnetic-field measurement device 60 is succeeded. If the magnetic-field generation device 30 causes the electromagnet 34 to generate the magnetic field regardless of whether the authentication of the magnetic-field measurement device 60 is succeeded, the magnetic-field generation device 30 may not authenticate the magnetic-field measurement device 60, and the magnetic-field measurement device 60 may not transmit the result of the authentication of the magnetic-field generation device 30 to the magnetic-field generation device 30.

In the present-position measurement system 10, the magnetic-field generation device 30 can change the strength of the magnetic field to be generated by the electromagnet 34, and the strength of the magnetic field generated by the electromagnet 34 can thus be adjusted to an appropriate strength depending on the environment around the magnetic-field generation device 30. For example, the magnetic-field generation device 30 can increase the strength of the magnetic field to be generated by the electromagnet 34 in order to reduce the influence of the environment around the magnetic-field generation device 30 on the magnetic field to be generated by the electromagnet 34, or can decrease the strength of the magnetic field to be generated by the electromagnet 34 in order to reduce the influence of the magnetic field to be generated by the electromagnet 34 on the environment around the magnetic-field generation device 30.

In the present embodiment, in the present-position measurement system 10, the magnetic-field generation device 30 can change the strength of the magnetic field to be generated by the electromagnet 34 (S101 to S105). However, the magnetic-field generation device 30 may fix the strength of the magnetic field to be generated by the electromagnet 34.

In the present embodiment, in the present-position measurement system 10, the magnetic-field generation devices 30 and 40 are installed on the floor 91 of the space 90, and the magnetic-field generation device 50 is installed on the ceiling 92 of the space 90. However, in the present-position measurement system 10, the magnetic-field generation devices may be installed in a pattern other than the pattern in which two magnetic-field generation devices are installed on the floor 91 and one magnetic-field generation device is installed on the ceiling 92. For example, in the present-position measurement system 10, one magnetic-field generation device may be installed on the floor 91, and two magnetic-field generation devices may be installed on the ceiling 92. Note that a human is usually closer to the floor 91 than the ceiling 92. Therefore, when the magnetic-field measurement device 60 is carried by the user 95 and when two magnetic-field generation devices are installed on the floor 91 and one magnetic-field generation device is installed on the ceiling 92, the present-position measurement system 10 can improve the accuracy of the present position measurement by the magnetic-field measurement device 60 as compared to a case where one magnetic-field generation device is installed on the floor 91 and two magnetic-field generation devices are installed on the ceiling 92.

In the present embodiment, the magnetic-field measurement device 60 performs various operations. However, at least a part of the operations of the magnetic-field measurement device 60 in the present embodiment may be performed by the magnetic-field generation device, or may be performed by external computers of both the magnetic-field generation device and the magnetic-field measurement device 60, such as cloud servers. For example, a cloud server may constitute the present-position measurement device.

In the present embodiment, the magnetic-field measurement device 60 stores various types of information. However, at least a part of the information stored by the magnetic-field measurement device 60 in the present embodiment may be stored by the magnetic-field generation device, or may be stored by external storage units of both the magnetic-field generation device and the magnetic-field measurement device 60, such as cloud servers.

In the present embodiment, the magnetic-field generation device performs various operations. However, at least a part of the operations of the magnetic-field generation device in the present embodiment may be performed by the magnetic-field measurement device 60, or may be performed by external computers of both the magnetic-field generation device and the magnetic-field measurement device 60, such as cloud servers.

In the present embodiment, the magnetic-field generation device stores various types of information. However, at least a part of the information stored by the magnetic-field generation device in the present embodiment may be stored by the magnetic-field measurement device 60, or may be stored by external storage units of both the magnetic-field generation device and the magnetic-field measurement device 60, such as cloud servers.

In the present embodiment, in the present-position measurement system 10, the magnetic-field generation unit is constituted by an electromagnet. However, the magnetic-field generation unit may be constituted by something other than the electromagnet. For example, if both the operations shown in FIGS. 4 and 10 are not performed in the present-position measurement system 10, the magnetic-field generation unit may be constituted by a permanent magnet.

In the present embodiment, the magnetic-field generation unit is included in the magnetic-field generation device. However, the magnetic-field generation unit may not be a part of the magnetic-field generation device. For example, in the present-position measurement system 10, only a magnet as the magnetic-field generation unit may be arranged at each position of the magnetic-field generation devices 30, 40, and 50 instead of these magnetic-field generation devices.

In the present embodiment, the present-position measurement system 10 is assumed to be used for present position measurement in the space 90 of about 100 m$^2$ in size. However, the present-position measurement system 10 may be used for present position measurement in a space of less than 100 m$^2$ or in a space of more than 100 m$^2$.

In the present embodiment, the present-position measurement system 10 is assumed to be used for present position measurement in an indoor space. However, the present-position measurement system 10 may be used for present position measurement in an outdoor space.

In the present embodiment, in the present-position measurement system 10, the magnetic-field measurement device 60 is carried by a user. However, in the present-position measurement system 10, the magnetic-field measurement device 60 may not be carried by a human. For example, the magnetic-field measurement device 60 may be attached to an animal or an inanimate object such as a robot.

For example, in the present-position measurement system 10, if the magnetic-field measurement device 60 is carried by a player of a 3D game, changes in the position measured by the magnetic-field measurement device 60, that is, the movement of the player may be reflected in the 3D game.

For example, in the present-position measurement system 10, if the magnetic-field measurement device 60 is carried by a player of sports such as table tennis, gymnastics, or e-sports, changes in the present position measured by the magnetic-field measurement device 60, that is, the movement of the player may be used for strategy analysis or guidance by a coach in the sport.

For example, in the present-position measurement system 10, if the magnetic-field measurement device 60 is carried by a user, changes in the present position measured by the magnetic-field measurement device 60, that is, the movement of the user may be used to create a computer graphics (CG) animation.

For example, in the present-position measurement system 10, if the magnetic-field measurement device 60 is attached to an object such as a shopping cart or a shopping basket to be used by a customer in a store, changes in the present position measured by the magnetic-field measurement device 60, that is, the movement of the customer may be used for investigation and analysis of the flow line of the customer in the store.

For example, in the present-position measurement system 10, if the magnetic-field measurement device 60 is carried by a customer and a staff in an event or is attached to an object moving in the event, changes in the present position measured by the magnetic-field measurement device 60, that is, the movement of the customer, the staff, and the object in the event may be used for investigation and analysis of the flow lines of the customer, the staff, and the object in the event.

For example, in the present-position measurement system 10, if the magnetic-field measurement device 60 is carried by a child in a play area for children, changes in the present position measured by the magnetic-field measurement device 60, that is, the movement of the child may be used for investigation and analysis of the tendencies in child's play in the play area.

For example, in the present-position measurement system 10, if the magnetic-field measurement device 60 is attached to a cleaning robot that automatically moves to clean floors and walls, changes in the present position measured by the magnetic-field measurement device 60, that is, the movement of the cleaning robot may be used to control the cleaning robot.

What is claimed is:

1. A present-position measurement system comprising:
a magnetic-field generation unit configured to generate a magnetic field;
a magnetic sensor configured to measure a direction of the magnetic field generated by the magnetic-field generation unit; and
a present-position measurement unit configured to measure a present position of the magnetic sensor, wherein
the present-position measurement unit measures the present position of the magnetic sensor relative to the magnetic-field generation unit based on the direction of the magnetic field measured by the magnetic sensor, and
wherein the present-position measurement unit measures the present position of the magnetic sensor when authentication of the magnetic-field generation unit has been succeeded.

2. The present-position measurement system according to claim 1, further comprising:
a magnetic-field generation device including the magnetic-field generation unit; and
a present-position measurement device including the present-position measurement unit, wherein
the authentication of the magnetic-field generation unit is performed using specific short-range wireless communication between the magnetic-field generation device and the present-position measurement device, and
the present-position measurement unit terminates the measurement of the present position of the magnetic sensor when the magnetic-field generation device and the present-position measurement device cannot communicate with each other using the specific short-range wireless communication after the authentication of the magnetic-field generation unit has been succeeded.

3. The present-position measurement system according to claim 2, wherein the present-position measurement unit continues the measurement of the present position of the magnetic sensor while the magnetic-field generation device and the present-position measurement device can communicate with each other using the specific short-range wireless communication after the authentication of the magnetic-field generation unit has been succeeded.

4. The present-position measurement system according to claim 1, further comprising
a magnetic-field generation device including the magnetic-field generation unit, wherein
the magnetic-field generation device causes the magnetic-field generation unit to generate the magnetic field when authentication of the magnetic sensor has been succeeded.

5. A present-position measurement system comprising:
a magnetic-field generation unit configured to generate a magnetic field;
a magnetic sensor configured to measure a direction of the magnetic field generated by the magnetic-field generation unit;
a present-position measurement unit configured to measure a present position of the magnetic sensor,
wherein the present-position measurement unit measures the present position of the magnetic sensor relative to the magnetic-field generation unit based on the direction of the magnetic field measured by the magnetic sensor; and
a magnetic-field generation device including the magnetic-field generation unit,
wherein the magnetic-field generation device causes the magnetic-field generation unit to generate the magnetic field when authentication of the magnetic sensor has been succeeded.

6. The present-position measurement system according to claim 5, further comprising
a device including the magnetic sensor, wherein
the device is separate from the magnetic-field generation device,
the authentication of the magnetic sensor is performed using specific short-range wireless communication between the magnetic-field generation device and the device, and
the magnetic-field generation device terminates the generation of the magnetic field by the magnetic-field generation unit when the magnetic-field generation device and the device cannot communicate with each other using the specific short-range wireless communication after the authentication of the magnetic sensor has been succeeded.

7. The present-position measurement system according to claim 6, wherein the magnetic-field generation device continues the generation of the magnetic field by the magnetic-field generation unit while the magnetic-field generation device and the device can communicate with each other using the specific short-range wireless communication after the authentication of the magnetic sensor has been succeeded.

8. A present-position measurement device comprising
a present-position measurement unit configured to measure a present position of a magnetic sensor configured to measure a direction of a magnetic field generated by a magnetic-field generation unit configured to generate the magnetic field, wherein
the present-position measurement unit measures the present position of the magnetic sensor relative to the magnetic-field generation unit based on the direction of the magnetic field measured by the magnetic sensor, and
the present-position measurement unit measures the present position of the magnetic sensor when authentication of the magnetic-field generation unit has been succeeded.

9. The present-position measurement device according to claim 8, wherein
the authentication of the magnetic-field generation unit is performed using specific short-range wireless communication between a magnetic-field generation device including the magnetic-field generation unit and the present-position measurement device, and
the present-position measurement unit terminates the measurement of the present position of the magnetic sensor when the magnetic-field generation device and the present-position measurement device cannot communicate with each other using the specific short-range wireless communication after the authentication of the magnetic-field generation unit has been succeeded.

10. The present-position measurement device according to claim 9, wherein the present-position measurement unit continues the measurement of the present position of the magnetic sensor while the magnetic-field generation device and the present-position measurement device can communicate with each other using the specific short-range wireless communication after the authentication of the magnetic-field generation unit has been succeeded.

11. A computer-readable non-transitory storage medium storing a present-position measurement program causing a computer to implement a present-position measurement unit configured to measure a present position of a magnetic sensor configured to measure a direction of a magnetic field generated by a magnetic-field generation unit configured to generate the magnetic field, wherein
the present-position measurement unit measures the present position of the magnetic sensor relative to the magnetic-field generation unit based on the direction of the magnetic field measured by the magnetic sensor, and
the present-position measurement unit measures the present position of the magnetic sensor when authentication of the magnetic-field generation unit has been succeeded.

12. The storage medium according to claim 11, wherein the authentication of the magnetic-field generation unit is performed using specific short-range wireless communication between a magnetic-field generation device including the magnetic-field generation unit and the computer, and
the present-position measurement unit terminates the measurement of the present position of the magnetic sensor when the magnetic-field generation device and the computer cannot communicate with each other using the specific short-range wireless communication after the authentication of the magnetic-field generation unit has been succeeded.

13. The storage medium according to claim 12, wherein the present-position measurement unit continues the measurement of the present position of the magnetic sensor while the magnetic-field generation device and the computer can communicate with each other using the specific short-range wireless communication after the authentication of the magnetic-field generation unit has been succeeded.

14. A magnetic-field generation device comprising a magnetic-field generation unit configured to generate a magnetic field, wherein
the magnetic-field generation device causes the magnetic-field generation unit to generate the magnetic field when authentication of a magnetic sensor configured to measure a direction of the magnetic field generated by the magnetic-field generation unit has been succeeded.

15. The magnetic-field generation device according to claim 14, wherein
the authentication of the magnetic sensor is performed using specific short-range wireless communication between the magnetic-field generation device and a device including the magnetic sensor, and
the magnetic-field generation device terminates the generation of the magnetic field by the magnetic-field generation unit when the magnetic-field generation device and the device cannot communicate with each other using the specific short-range wireless communication after the authentication of the magnetic sensor has been succeeded.

16. The magnetic-field generation device according to claim 15, wherein the magnetic-field generation device continues the generation of the magnetic field by the magnetic-field generation unit while the magnetic-field generation device and the device can communicate with each other using the specific short-range wireless communication after the authentication of the magnetic sensor has been succeeded.

17. A computer-readable non-transitory storage medium storing a magnetic-field generation program causing a computer to implement a function of causing a magnetic-field generation unit configured to generate a magnetic field to generate the magnetic field when authentication of a magnetic sensor configured to measure a direction of the magnetic field generated by the magnetic-field generation unit has been succeeded.

18. The storage medium according to claim 17, wherein
the authentication of the magnetic sensor is performed using specific short-range wireless communication between the computer and a device including the magnetic sensor, and
the magnetic-field generation program causes the computer to implement a function of terminating the generation of the magnetic field by the magnetic-field generation unit when the computer and the device cannot communicate with each other using the specific short-range wireless communication after the authentication of the magnetic sensor has been succeeded.

19. The storage medium according to claim 18, wherein the magnetic-field generation program causing the computer to implement a function of continuing the generation of the magnetic field by the magnetic-field generation unit while the computer and the device can communicate with each other using the specific short-range wireless communication after the authentication of the magnetic sensor has been succeeded.

* * * * *